United States Patent [19]
Patel et al.

[11] Patent Number: 5,369,314
[45] Date of Patent: Nov. 29, 1994

[54] PROGRAMMABLE LOGIC DEVICE WITH REDUNDANT CIRCUITRY

[75] Inventors: Rakesh H. Patel, Santa Clara; Myron W. Wong, San Jose, both of Calif.

[73] Assignee: Altera Corporation, San Jose, Calif.

[21] Appl. No.: 199,620

[22] Filed: Feb. 22, 1994

[51] Int. Cl.$^5$ .......................................... H03K 19/177
[52] U.S. Cl. ...................... 326/13; 326/39; 326/44
[58] Field of Search ............... 307/441, 443, 465, 475, 307/243; 365/200, 230.03

[56] References Cited

U.S. PATENT DOCUMENTS

| | | | |
|---|---|---|---|
| Re. 33,521 | 1/1991 | Mori et al. | 364/200 |
| 3,955,261 | 11/1976 | Goldberg | 340/173 BB |
| 4,020,469 | 4/1977 | Manning | 340/172.5 |
| 4,538,247 | 8/1985 | Venkateswatan | 365/200 X |
| 4,566,102 | 1/1986 | Hefner | 371/11 |
| 4,691,301 | 9/1987 | Anderson | 365/200 |
| 4,706,216 | 11/1987 | Carter | 365/94 |
| 4,791,319 | 12/1988 | Tagami et al. | 307/441 |
| 4,798,976 | 1/1989 | Curtin et al. | 307/441 |
| 4,800,302 | 1/1989 | Marum | 307/441 |
| 4,829,198 | 5/1989 | Maley et al. | 307/441 |
| 4,899,067 | 2/1990 | So et al. | 307/465 |
| 4,928,022 | 5/1990 | Marum | 307/465 X |
| 5,019,736 | 5/1991 | Furtek | 307/465 |
| 5,045,720 | 9/1991 | Bae | 307/441 |
| 5,204,836 | 4/1993 | Reed | 365/200 |

OTHER PUBLICATIONS

*Recent Developments in Switching Theory*, A. Mukhopadhyay, ed., Academic Press, N.Y., 1971, chapters VI and IX, pp. 229–254 and 369–422.

K. Kokkonen et al., "Memories and Redundancy Techniques", Digest of Technical Papers, IEEE International Solid-State Circuits Conference, pp. 80–1, Feb., 1981.

J. Bindels et al., "Cost-effective Yield Improvement in Fault-tolerant VLSI Memory", Digest of Technical Papers, IEEE International Solid-State Circuits Conference, pp. 82–3, Feb., 1981.

S. Eaton et al., "A 100ns 64K Dynamic RAM using Redundancy Techniques", Digest of Technical Papers, IEEE International Solid-State Circuits Confernece, pp. 84–5, Feb., 1981.

F. Hatori et al., "Introducing Redundancy in Field Programmable Gate Arrays", Proceedings of the IEEE 1993 Custom Integrated Circuits Conference, pp. 7.1.1–7.1.4, May, 1993.

Preliminary Data booklet for Altera 32 Macrocell High Density Max EPLD EPM5032, 1988, Altera Corporation, Santa Clara (now San Jose), Calif.

"Programmable Logic Devices with Spare Circuits for Use in Replacing Defective Circuits".

*Primary Examiner*—David R. Hudspeth
*Attorney, Agent, or Firm*—Robert R. Jackson; G. Victor Treyz

[57] ABSTRACT

A programmable logic device is provided that has redundant circuitry. When a portion of the programmable logic device circuitry is found to be defective, the redundant circuitry is switched into use in place of the defective circuitry by programming appropriate portions of the circuitry of the programmable logic device. The programmable logic device is arranged in rows and columns of programmable logic containing logic array blocks, which a user selectively configures by loading programming data into vertical and horizontal programming blocks. Programming blocks are used to program the logic array blocks and various associated logic circuitry. When the redundant circuitry is switched into place, the programming data is redirected to the appropriate programming blocks, so that the device functions identically, regardless of whether or not the redundant circuitry is used.

31 Claims, 11 Drawing Sheets

PROGRAMMABLE LOGIC DEVICE WITH REDUNDANT CIRCUITRY

BACKGROUND OF THE INVENTION

The present invention relates to programmable logic devices, more particularly to redundant circuitry for replacing defective circuits.

Programmable logic devices contain circuits that may be configured by a user to provide various logic functions. During the process of manufacturing such devices, an occasional defect may develop which renders the circuit inoperable. Sometimes the defect is serious enough that the device must be discarded. However, if only a small portion of the circuitry is affected, the device can often be repaired by switching redundant circuitry into use in place of the defective circuitry.

An example of a programmable logic device that has redundant circuitry is shown in So et al. U.S. Pat. No. 4,899,067. The device shown in the So et al. patent has sum-of-products logic which is subdivided into relatively small units called macrocells. When a macrocell is found to be defective it is replaced by switching in a nearby redundant macrocell. This approach allows devices with macrocell defects at various locations across the device to be repaired. However, defects often occur only at relatively localized areas on the device. In that case, much of the circuitry that is used to switch the redundant macrocells into place is not required. If the unneeded switching circuitry could be eliminated, the programmable logic device would have improved performance and would be less expensive to manufacture.

It is therefore an object of the present invention to improve and simplify the provision and use of redundant circuits in programmable logic devices.

It is another object of this invention to provide programmable logic devices with redundant circuits for replacement of defective circuits on a relatively large scale so that the overhead associated with controlling the use of the redundant circuits can be substantially reduced.

SUMMARY OF THE INVENTION

These and other objects of the invention are accomplished in accordance with the principles of the invention by providing a programmable logic device with redundant circuitry that can be arranged in the form of a redundant column or row of logic. When it is determined that a portion of the programmable logic device is defective, the manufacturer repairs the device by replacing the column or row of logic containing the defective portion with the redundant column or row. Switching circuitry is provided to redirect programming and data signals that would normally go to the defective portion of the device to the non-defective portion. Switching circuitry is also provided for switching the output signals from the non-defective portion back to the normal destinations of the output signals of the defective circuitry. Therefore, even if the manufacturer repairs a device, the overall operation of the device is unaffected. For example, the external input and output pins are used identically and the device accepts exactly the same programming data whether perfect or repaired. Further features of the invention, its nature and various advantages, will be more apparent from the accompanying drawings and the following detailed description of the preferred embodiments.

DETAILED DESCRIPTION OF THE PREFERRED EMBODIMENTS

For purposes of illustration the invention will be described in the context of programmable logic devices of the type shown in commonly assigned, co-pending U.S. patent application Ser. No. 08/038,787, filed Mar. 29, 1993, which is hereby incorporated by reference herein. It will be understood, however, that the invention is equally applicable to many other types of programmable logic devices.

Figure 1:
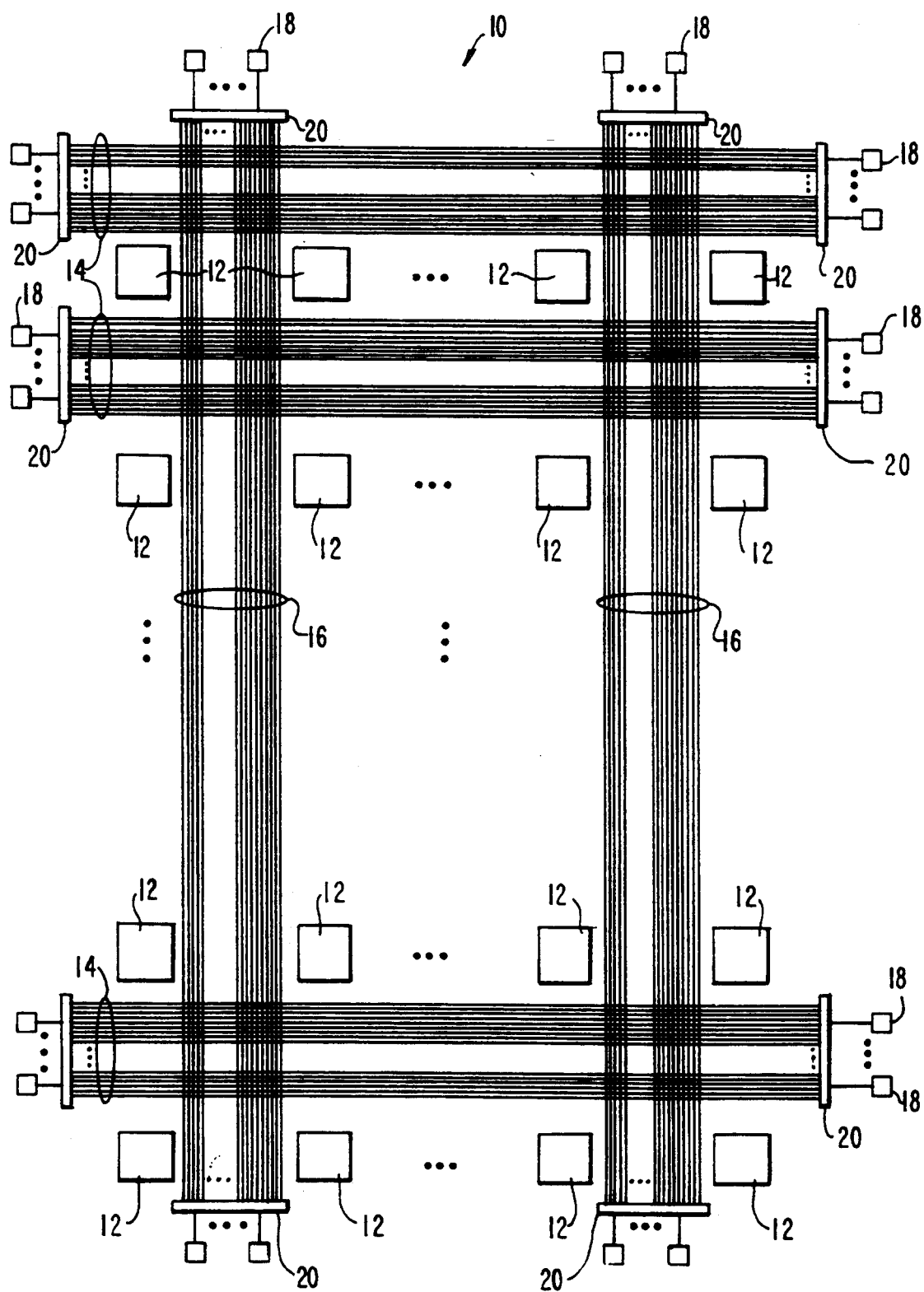
FIG. 1 is a simplified block diagram of an illustrative programmable logic device which can be constructed in accordance with the principles of this invention.

An illustrative programmable logic device 10, which can be constructed in accordance with the invention, is shown in FIG. 1. Not all of the circuitry of device 10 is shown to avoid over-complicating the drawing. Nevertheless, FIG. 1 shows that device 10 is generally organized in the form of an array having horizontal rows and vertical columns of logic. Logic array blocks 12, are interconnected by horizontal conductors 14 and vertical conductors 16, which are connected to input/output pins 18 via input/output logic 20. Input/output logic 20 contains multiplexing and demultiplexing circuitry which can be programmed to selectively connect the relatively large number of horizontal and vertical conductors to the smaller number of input/output pins 18.

Figure 2:
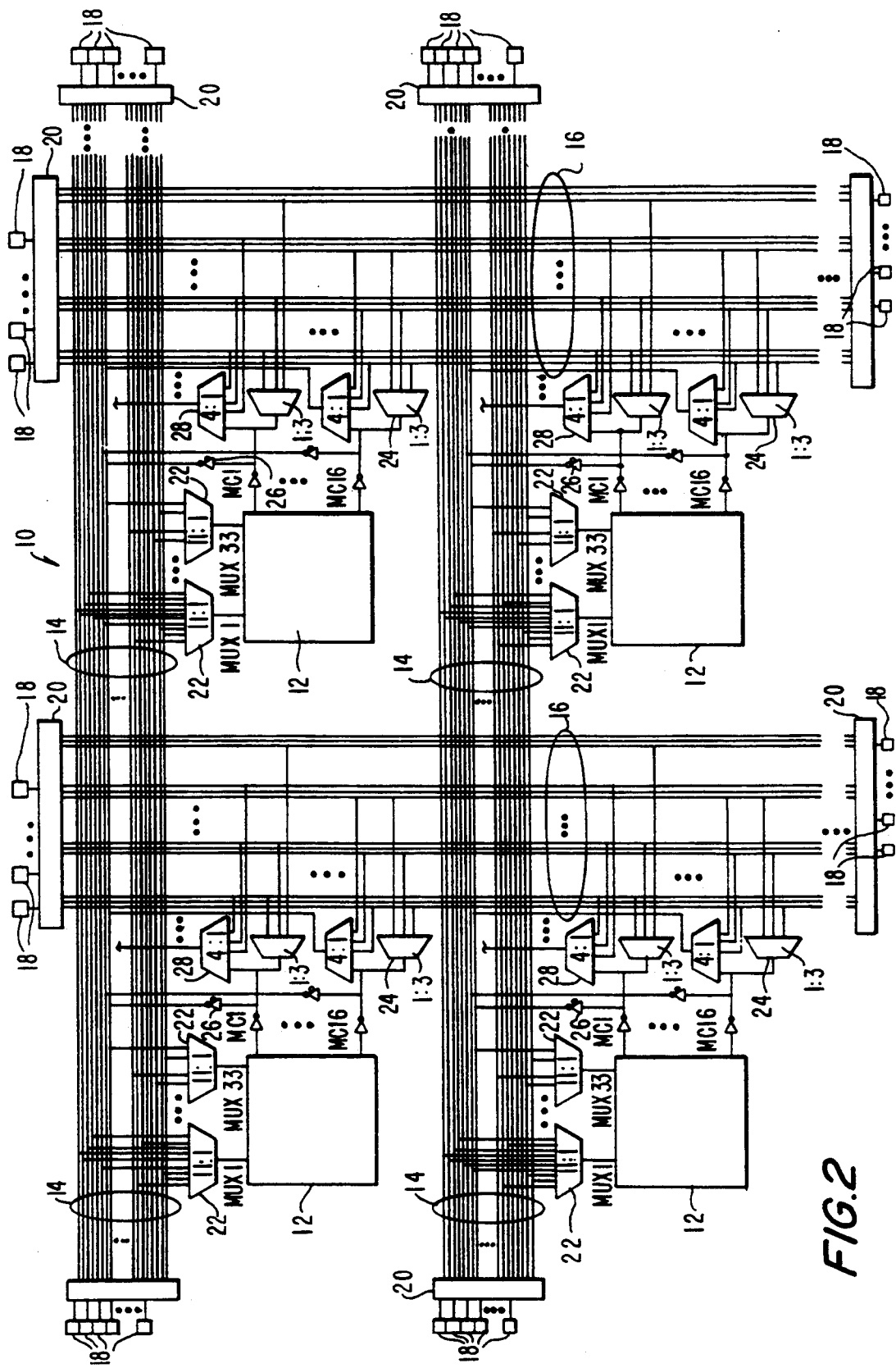
FIG. 2 is a more detailed, but still simplified schematic block diagram of representative portions of the circuit of FIG. 1 showing aspects of an illustrative embodiment of this invention.

As shown in FIG. 2, logic array blocks 12 receive signals from horizontal conductors 14 via horizontal input multiplexers 22. Many connections, including the connections between the horizontal conductors 14 and the horizontal input multiplexers 22, are made in a random pattern, in order to ensure that interconnection pathways are blocked as infrequently as possible. The outputs of each logic array block 12 are connected to demultiplexers 24 and multiplexers 28, which are connected to vertical conductors 16. If desired, the logic array block outputs may be directed to the horizontal conductors 14 by tristate drivers 26, which are connected to horizontal conductors 14 in a random pattern. Although only some of the logic array block outputs are shown, each logic array block 12 contains 16 macrocells of logic. Each macrocell generates a corresponding logic array block output signal. Accordingly, there are 16 demultiplexers 24 and 16 tristate drivers 26 for each logic array block 12. In addition, there are 16 multiplexers 28 per logic array block 12, which are connected to the horizontal and vertical conductors in a random pattern. Multiplexers 28 are used to pass signals from vertical conductors 16 to horizontal conductors 14 and to direct output signals from the logic array blocks 12 to horizontal conductors 14.

Programmable logic device 10 has 11 normal rows of logic array blocks 12 and six normal columns. Each row contains a set of 168 horizontal conductors 14 and each column contains a set of 48 vertical conductors 16. In addition, programmable logic device 10 may be provided with redundant columns or rows of logic array blocks. Following the initial fabrication of programmable logic device 10, the manufacturer tests the device to determine if the circuitry is fully operational. In the event that defective circuitry is detected the redundant circuitry can be switched into use.

The circuit configuration of programmable logic device 10 differs depending on whether redundant columns of logic or redundant rows of logic are used. The use of redundant columns of logic will be discussed first, followed by a description of the circuitry used to provide redundant rows of logic.

Figure 3:
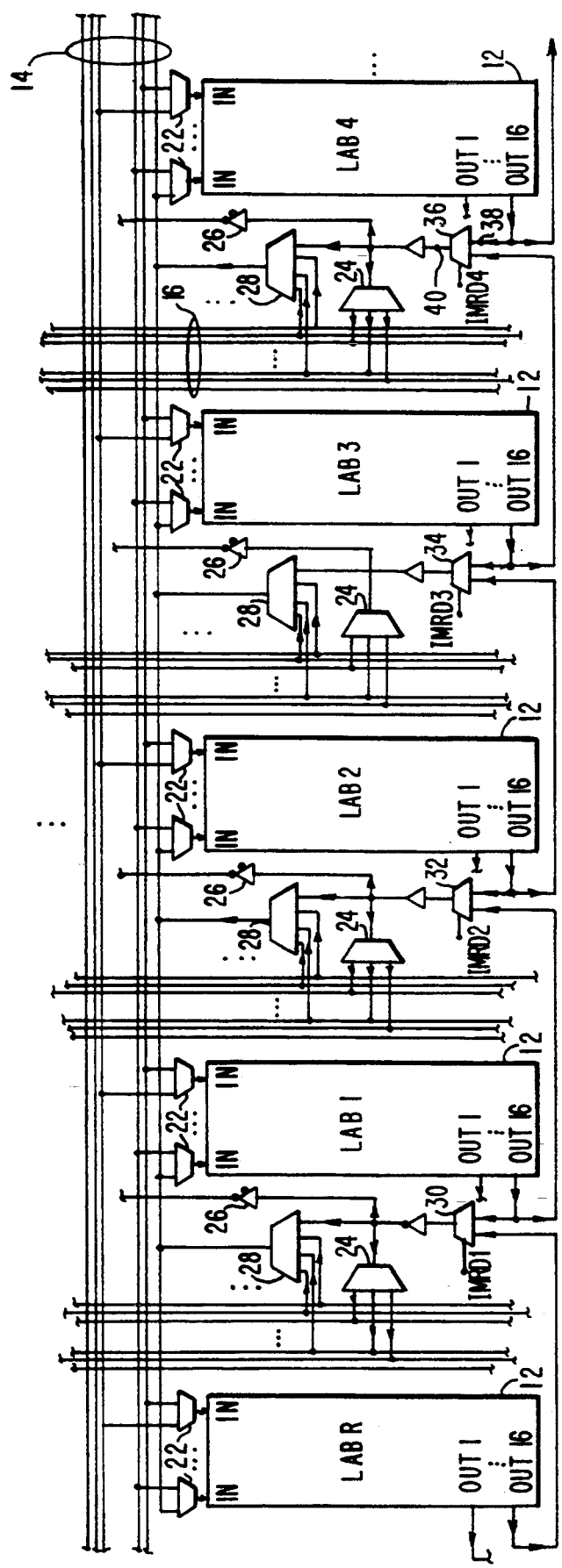
FIG. 3 is a simplified schematic block diagram of a portion of the circuit of FIG. 1 showing how certain signals are redirected around defective circuitry in an illustrative embodiment of the invention using a redundant column of logic.

If redundant column logic is used, an additional column of logic array blocks 12 may be provided as the leftmost column of programmable logic array 12. If testing reveals a defect in one of the columns of programmable logic device 10, then that column is replaced by the column to its immediate left. This pattern is repeated across the device until the leftmost column is used. All rows of programmable logic device 10 are identical to the one shown in FIG. 3. FIG. 3 shows a representative row of programmable logic device 10 configured to use redundant column logic. As shown in FIG. 3, the redundant column of logic array blocks 12 does not require a corresponding set of vertical conductors, allowing programmable logic device 10 to be fabricated as a smaller, and therefore less expensive, integrated circuit than would otherwise be possible. Although only one demultiplexer 24, one multiplexer 28, and one tristate driver 26 are shown for each logic array block 12, there are 16 such sets per logic array block 12, each connected to one of the 16 logic array block outputs. The outputs of logic array block 12 are connected to multiplexers, such as multiplexer 30, shown in the first column. Multiplexers 32, 34, and 36 are connected to logic array blocks 12 in the second, third, and fourth columns, respectively. Multiplexers 30, 32, 34, and 36 each receive a control signal (labeled "IMRD"), which determines which of the two inputs to the multiplexer will be selected.

Each multiplexer 30, 32, 34, or 36 in a column receives the same control signal. The default value of the control signals is a logic high, which causes the multiplexers in the column to direct the output from the logic array blocks to demultiplexers 24, multiplexers 28, and tristate drivers 26 in the same column. For example, if the signal IMRD4 is a logic high, then multiplexer 36 applies the signal received at input terminal 38 to output terminal 40, so that the output signal from the logic array block 12 in the fourth column is applied to demultiplexer 24 in the fourth column, which in turn passes the signal to the vertical conductors 16 in the same column. The output signal at output terminal 40 is also applied to the horizontal conductors 14 by tristate driver 26.

If it is determined during testing that some of the circuitry is defective, for example in the third column, then the control signals to multiplexers 30, 32, and 34, (IMRD1, IMRD2, and IMRD3), are all made a logic low, while the control signal for multiplexer 36 (IMRD4) is maintained at a logic high. This allows the defective circuitry in the logic array blocks 12 in the third column (LAB3) to be replaced with the fully functional logic blocks from the second column (LAB2). Because the control signal for multiplexer 34 is low, the outputs from the logic array blocks 12 in the second column (LAB2) are directed to demultiplexers 24, multiplexers 28, and tristate drivers 26 in the third column, which are normally used by the logic array blocks 12 in the third column (LAB3). Similarly, the outputs of the logic array block 12 in first column (LAB1) are shifted to the demultiplexers 24, multiplexers 28, and tristate drivers 26 normally used by the second column. Further, the outputs from the logic array block 12 in the redundant column (LABR) are connected to the demultiplexers 24, multiplexers 28, and tristate drivers 26 normally used by the first column. Although the output signals of logic array blocks 12 must be shifted, the inputs to the logic array blocks 12 are not shifted, because the pattern of fixed connections between horizontal input multiplexers 22 and horizontal conductors 14 is the same for each logic array block 12.

The control signals IMRD1, IMRD2, IMRD3, and IMRD4, which are applied to multiplexers 30, 32, 34, and 36, are derived from signals that the manufacturer stores in programmable logic elements within the programmable logic device 10 following testing. The programmable logic elements may be based on erasable programmable read-only memory transistors, static random-access memory cells, programmable fuses, antifuses, ferro-electric elements, or any suitable type of logic component. Preferably, the programmable logic elements in programmable logic device 10 are based on electrically-erasable programmable read-only memory transistors. The default setting for the programmable logic elements is a logic high. If a logic low is desired, the programmable logic element must be "programmed" accordingly.

Figure 4:
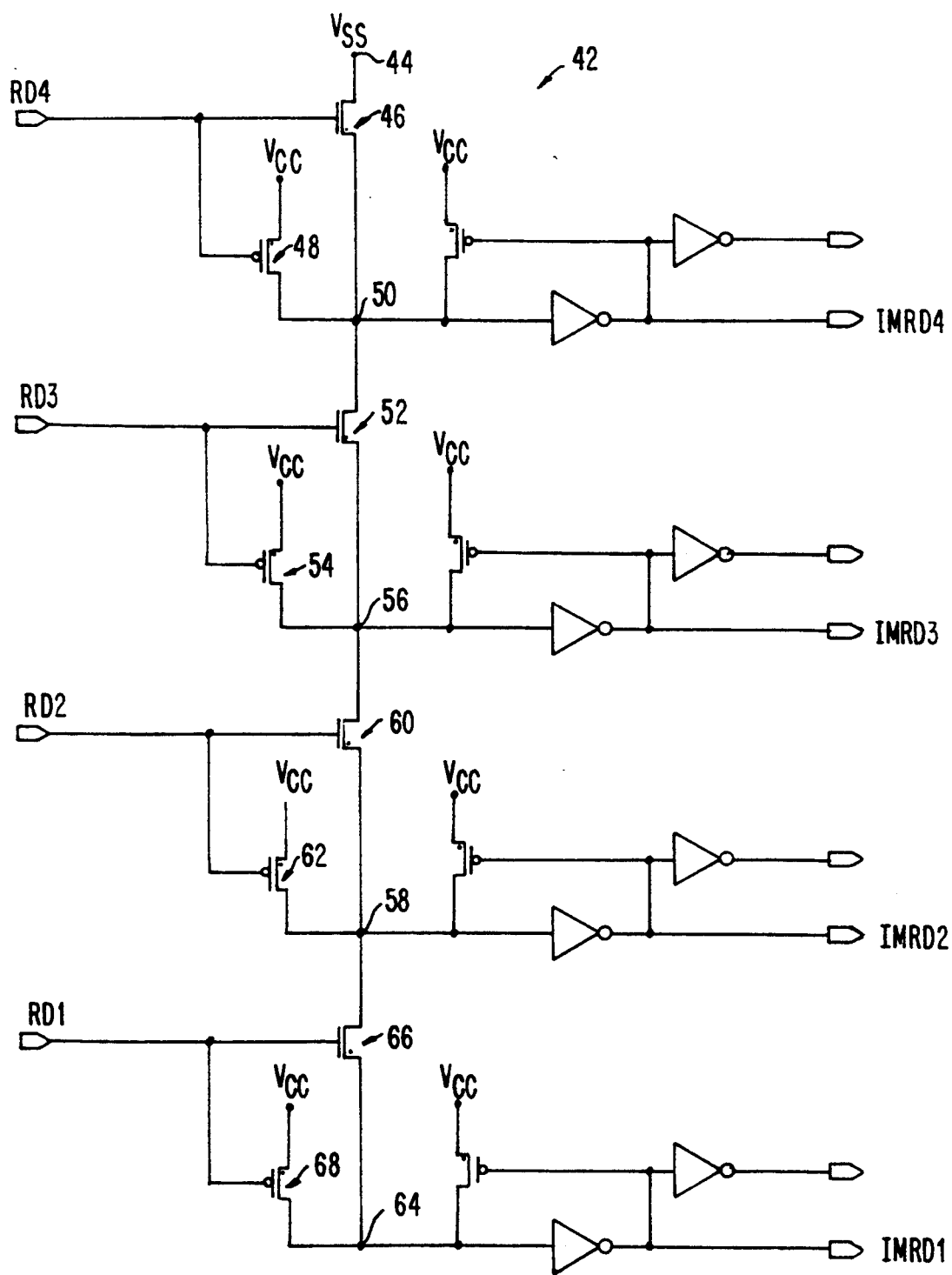
FIG. 4 is a simplified diagram of a circuit that is used to generate control signals in an illustrative embodiment of the invention.

Because it is generally desirable to reduce the time required for the manufacturer to switch the redundant circuitry into use, a control signal circuit 42, shown in FIG. 4, is used to reduce the number of programmable logic elements that the manufacturer must program. Signals RD1, RD2, RD3, and RD4 are received from programmable logic elements (such as programmable logic elements 80 shown in FIG. 6), which have been programmed by the manufacturer. Control signal circuit 42 generates control signals IMRD1, IMRD2, IMRD3, and IMRD4, which are applied to the multiplexers 30, 32, 34, and 36 (FIG. 3). Although the control signal circuit 42 shown in FIG. 4 produces four control signals, it will be appreciated that the number of control signals that are generated will depend on the number of columns of logic array blocks 12 contained within programmable logic device 10. For example, if programmable logic device 10 contains six columns of normal logic and an additional column of redundant logic, six control signals are required.

Control signal circuit 42 reduces the number of programmable logic elements (FIG. 6) that must be programmed, because only the programmable logic element corresponding to the column that contains a defect must be changed. For example, if the third column is found to contain a defect, only the signal RD3 is made low, whereas the signals RD1, RD2, and RD4 are left at the default high setting. As shown in FIG. 4, terminal 44 is supplied with the voltage $V_{ss}$, which is a logic low. The terminals labeled $V_{cc}$ are maintained at a logic high. Because RD4 is high, transistor 46 is on and transistor 48 is off, causing node 50 to be a logic low and control signal IMRD4 to be a logic high. Because RD3 is low, transistor 52 is off and transistor 54 is on, causing terminal 56 to be high and control signal IMRD3 to be low. The logic high at terminal 56 is passed to terminal 58, because RD2 is high, which turns on transistor 60 and turns off transistor 62. The logic high at node 58 causes control signal IMRD2 to be low. Further, the logic high at terminal 58 is passed to terminal 64, because RD1 is high, which turns on transistor 66 and turns off transistor 68. The logic high at node 64 causes control signal IMRD1 to be low.

The response of control signal circuit 42 to a low RD signal in the $n^{th}$ column is shown in Table 1.

TABLE 1

| $RD_{n-2}$ | $RD_{n-1}$ | $RD_n$ | $RD_{n+1}$ | $RD_{n+2}$ |
|---|---|---|---|---|
| 1 | 1 | 0 | 1 | 1 |
| $IMRD_{n-2}$ | $IMRD_{n-1}$ | $IMRD_n$ | $IMRD_{n+1}$ | $IMRD_{n+2}$ |
| 0 | 0 | 0 | 1 | 1 |

The control signal circuit 42 generates low IMRD control signals in all the columns up to and including the $n_{th}$ column. As described above, when the control signals are applied to the multiplexers, the outputs of the logic array blocks 12 in the columns to the left of the $n^{th}$ column are each shifted to the right (FIG. 3). Because it is only necessary to apply a logic low to the column containing the defective circuitry (the $n^{th}$ column), the redundant circuitry can be switched into use more quickly than would otherwise be possible.

Figure 5:
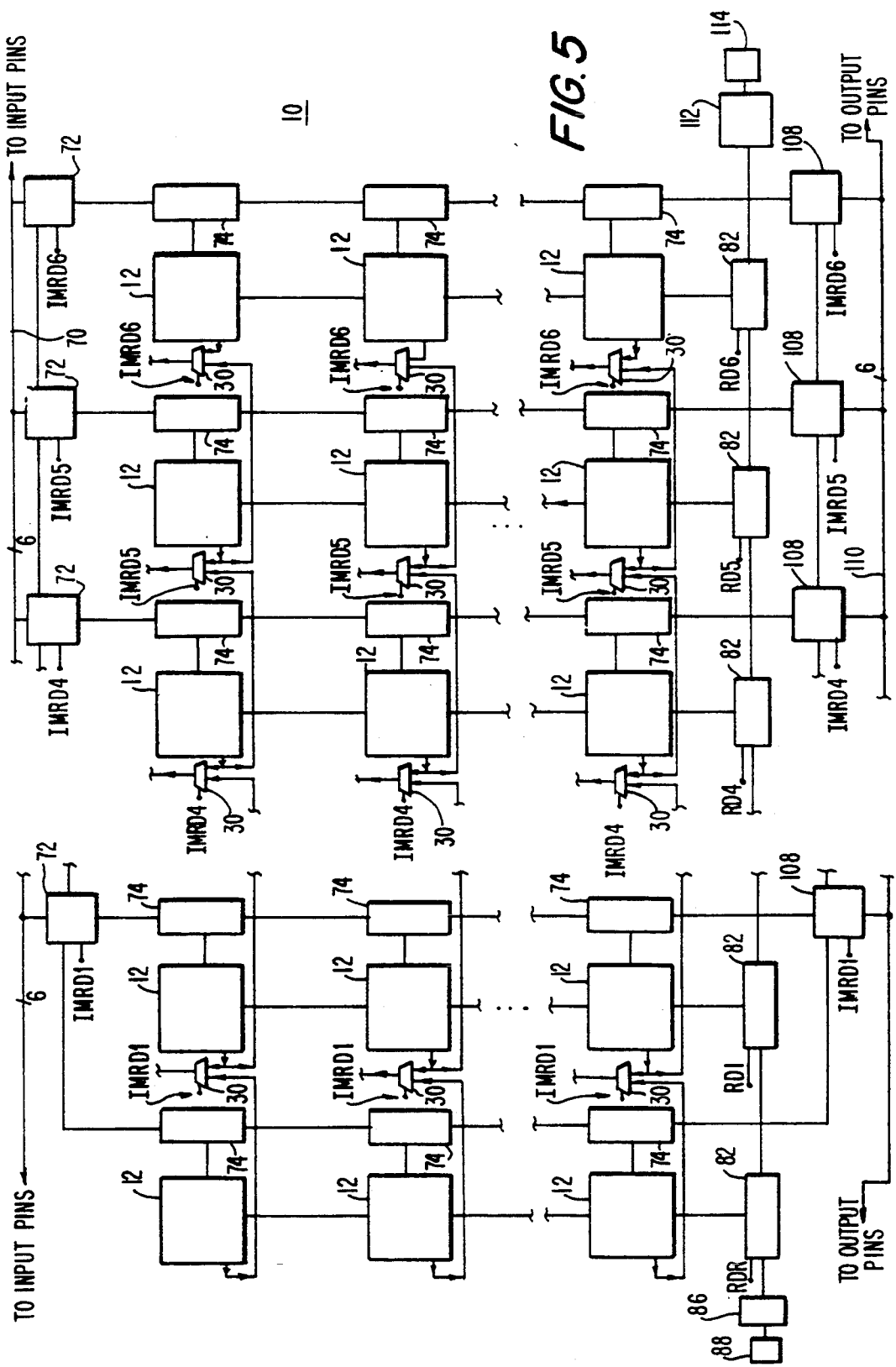
FIG. 5 is a simplified schematic block diagram of a portion of the circuit of FIG. 1 showing how programming signals and certain other signals are redirected when redundant column logic is used in an illustrative embodiment of the invention.

After the manufacturer has switched the redundant circuitry into place, programmable logic device 10 may be programmed by a user to provide a particular logic function. Additional circuitry contained within programmable logic device 10 is required to selectively program the various programmable logic elements contained within the device. For example, as shown in FIG. 5, programmable logic device 10 contains additional logic circuitry with which the user configures the logic contained within logic array blocks 12. Not all of the circuitry of programmable logic device 10 is shown in FIG. 5, to avoid over-complicating the drawing. For example, horizontal conductors 14 and vertical conductors 16 and the circuits connecting these conductors to the logic array blocks 12 are shown in FIG. 3, but are not shown in FIG. 5. In order to configure the logic array blocks 12, the user applies programming data to bus 70. When the redundant circuitry is used, the manufacturer must reconfigure the pathways for the programming data so that when a user subsequently programs programmable logic device 10, the correct logic array blocks 12 are programmed.

Figure 6:
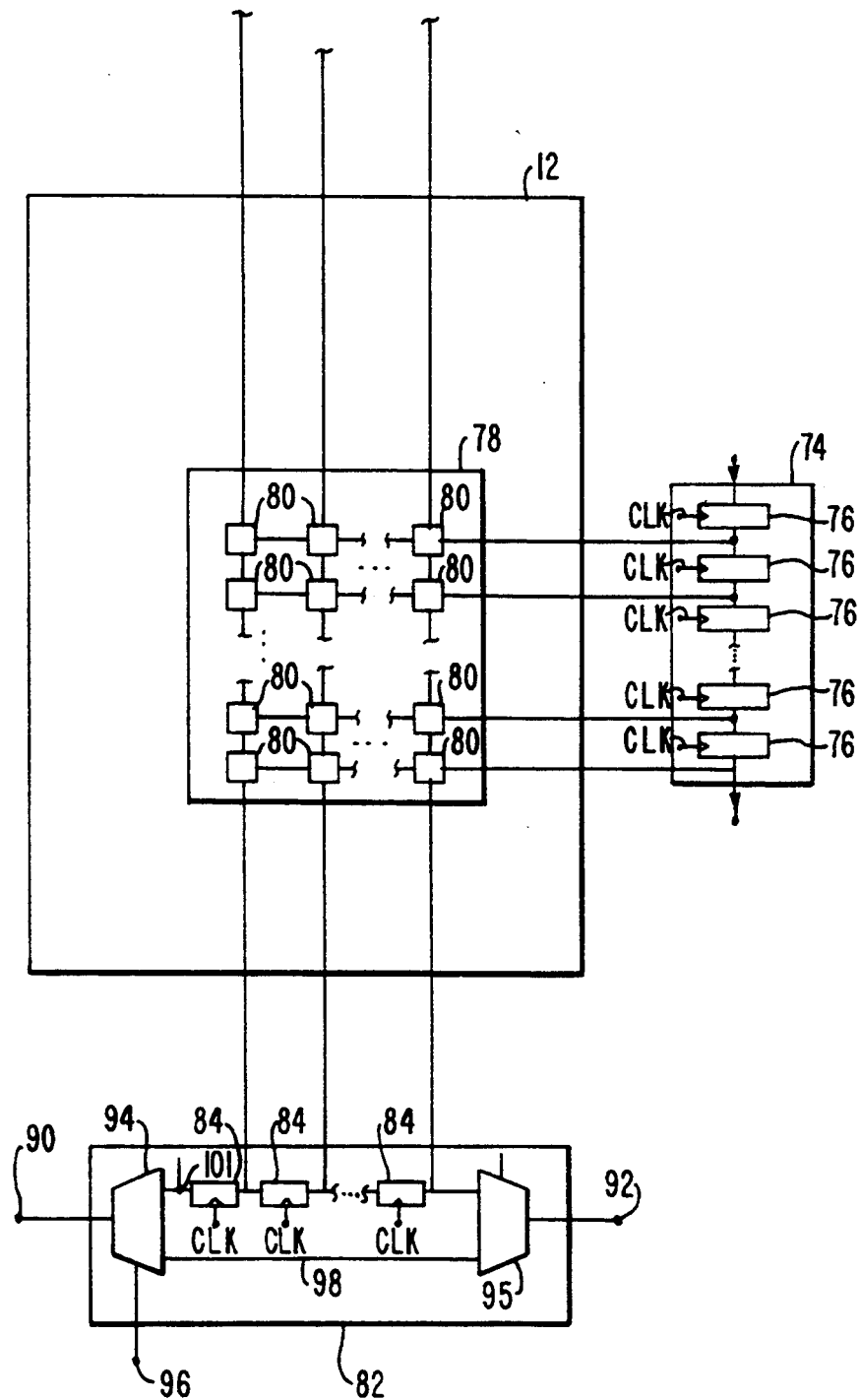
FIG. 6 is a simplified schematic block diagram that shows in greater detail portions of the circuitry shown in FIG. 5 in an illustrative embodiment of the invention.

As shown in FIG. 6, each vertical programming block 74 contains a chain of registers 76 through which the programming data is passed. The outputs of the registers 76 are applied to an array 78 of programmable logic elements 80, contained within logic array block 12. Similarly, horizontal programming block 82 contains serially-linked registers 84, which are connected to array 78. A user programs array 78 so that logic array block 12 performs the desired logic function. The outputs of the registers 76 and 84 form vertical and horizontal programming addresses, respectively, which are used to select which of the programmable logic elements within array 78 are programmed. As shown in FIG. 5, there is a vertical programming block 74 connected to each logic array block 12, whereas only one horizontal programming block 82 is required for each column of programmable logic array blocks 12. The output from the horizontal programming block 82 is applied simultaneously to each of the arrays 78 in the column.

The horizontal programming blocks 82 receive programming data via switch 86, which is connected to input pin 88, as shown in FIG. 5. When it is desired to program the programmable logic device, switch 86 is enabled, allowing the desired horizontal programming data to pass to horizontal programming blocks 82. If a defect is detected, the horizontal programming block 82 in the defective column is bypassed.

Registers 84 in horizontal programming block 82 can be bypassed by selectively connecting input terminal 90 to output terminal 92 with demultiplexer 94 and multiplexer 95, as shown in FIG. 6. If defective circuitry is found in a column, the manufacturer configures the device so that the control terminal 96 of demultiplexer 94 and the control terminal 93 of multiplexer 95 in that column are provided with a logic low, causing demultiplexer 94 and multiplexer 95 to direct programming data received at terminal 90 to terminal 92 via bypass conductor 98. When registers 84 of horizontal programming block 82 are bypassed, terminal 97 of logic element 99 is provided with a control signal that directs logic element 99 to take terminal 101 low, so that registers 84 are not inadvertently provided with a logic high. The control terminals of the demultiplexers 94 and multiplexers 95 in the other columns are provided with a logic high, so that in the horizontal programming blocks 82 in those columns, the programming data flows through the chain of registers 84.

Because only the control terminals of the demultiplexer 94 and multiplexer 95 in the defective column are provided with a logic low, control signal circuitry of the type shown in FIG. 4 cannot be used to control the bypassing of the horizontal programming blocks 82. Rather, the "RD" signals that are applied to the inputs of control signal circuit 42 (FIG. 4) are used to select which demultiplexer 94 and multiplexer 95 are bypassed. The signal RDR is also applied to the control terminals of the demultiplexer 94 and multiplexer 95 in the redundant column. If the column of redundant circuitry is not used, the RDR signal is low, so that the registers 84 in the redundant column are bypassed.

In addition to changing the path for the horizontal programming data, the manufacturer must also alter the path for the vertical programming data. If the redundant column of circuitry is not used, each switch 72 merely directs the vertical programming data to the vertical programming blocks 74 in the same column as the switch. If, however, defective circuitry is detected, switch 72 shifts the vertical programming data that would have been directed to the logic array blocks 12 in the defective column to the vertical programming blocks 74 in the next column to the left. Similarly, the switches 72 for each of the columns to the left of the defective column shift the vertical programming data one column to the left.

Figure 7:
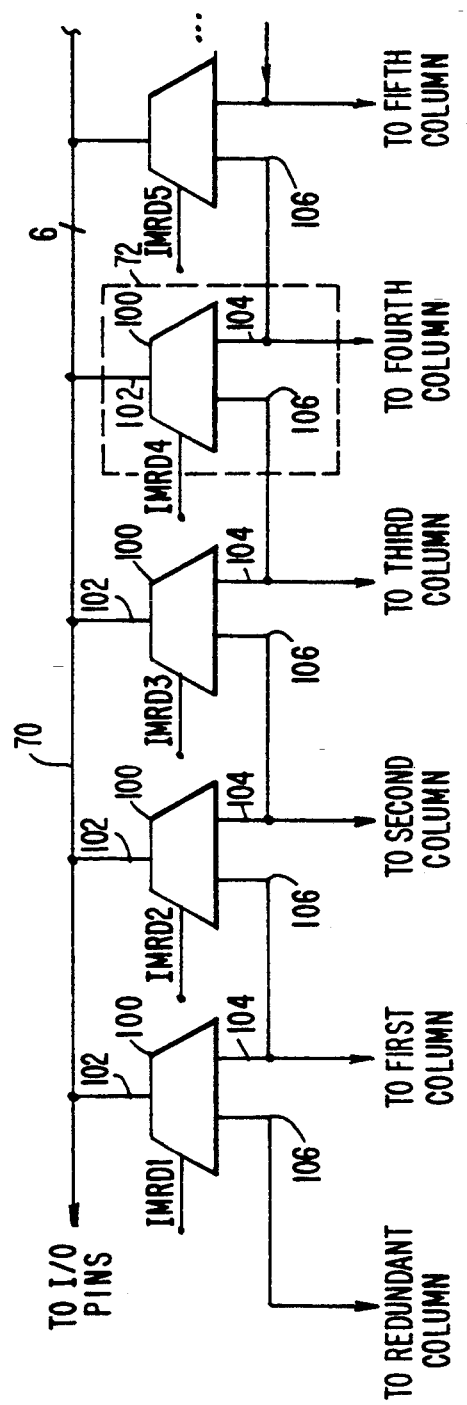
FIG. 7 is a simplified schematic diagram showing how portions of the circuit of FIG. 5 can be interconnected in accordance with an illustrative embodiment of the invention.

FIG. 7 shows how switches 72 are connected in a chain, so that the vertical programming data that is received from bus 70 can be shifted to the left when a column is determined to contain a defect. If no defects are detected, demultiplexers 100 direct the programming data received at inputs 102 to outputs 104. If defects are detected in a column, however, programming data signals that are received at the inputs 102 for that column and the columns to the left are directed to outputs 106. For example, if it is determined that the fourth column contains defective circuitry, the manufacturer programs a programmable logic element to a logic low. A control signal circuit of the type shown in FIG. 4 is provided with this logic low (signal RD4), whereas programmable logic elements that contain signals RD1, RD2, and RD3 remain at the default logic high level. The control signal circuit generates control signals IMRD1, IMRD2, IMRD3, and IMRD4, which are low, and signals IMRD5 and IMRD6, which are high. The control signals IMRD5 and IMRD6 control the demultiplexers 100 to the right of the fourth column. Because signals IMRD5 and IMRD6 are high, the vertical programming blocks 74 in the fifth and sixth columns receive programming data from demultiplexers 100 in the same columns. However, because the demultiplexers 100 in the first through fourth columns receive control signals that are low, in those columns demultiplexers 100 redirect the programming data received at inputs 102 to outputs 106.

The demultiplexer 100 in the first column redirects the data that would have been used to program the logic array blocks 12 in the first column to the vertical programming blocks 74 in the redundant column. Thus, when a user of the programmable logic device subsequently attempts to program the logic array blocks 12 in the first column, the logic arrays blocks 12 in the redundant column are programmed instead. However, because the outputs of the logic array blocks 12 have been shifted to the right, it will appear to the user as though the first column was in fact programmed. Therefore, even if the manufacturer replaces a defective column with the redundant circuitry of a spare column, a subsequent user will not be aware that the programmable logic device 10 has been repaired. Further, all programmable logic devices 10 perform identically, regardless of whether or not a defect is repaired.

As shown in FIG. 5, in addition to switches 86 and 72, programmable logic device 10 has switches 108, which direct the output of vertical logic blocks 74 to bus 110. Data may be read out of the vertical logic blocks 74 when it is desired to verify that logic array blocks 12 have been programmed correctly. Switches 108 are identical to switches 72 and are reconfigured in the same manner. Similarly, switch 112, which may be enabled to allow data from horizontal logic blocks 82 to pass to output pin 114, is identical to switch 86.

Figure 8:
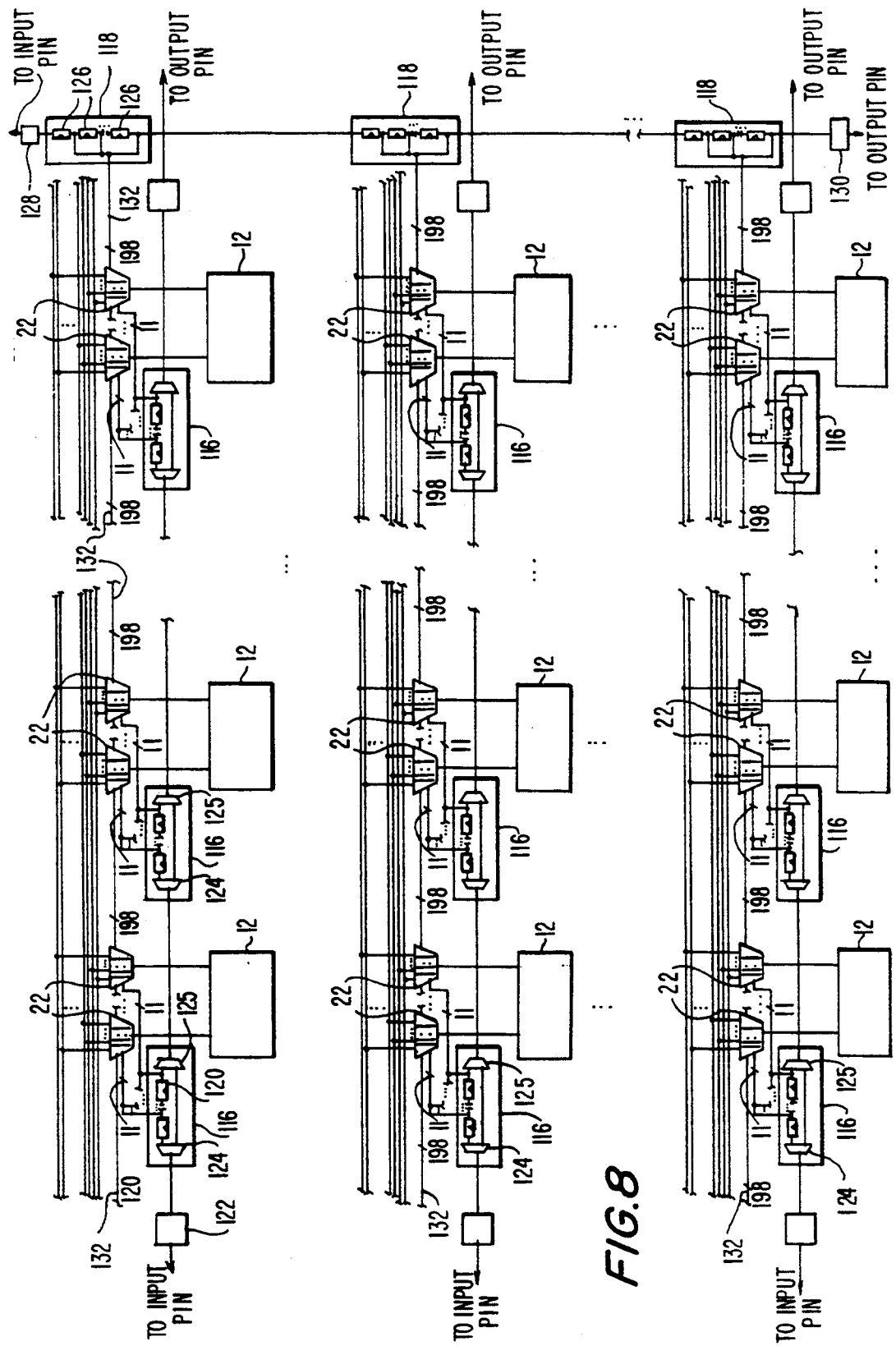
FIG. 8 is a simplified schematic diagram showing how the horizontal multiplexer programming signals are redirected when redundant column logic is used in accordance with an illustrative embodiment of the invention.

In addition to the vertical programming blocks 74 and horizontal programming blocks 82, programmable logic device 10 also has logic that allows a user to program the horizontal input multiplexers 22. A preferred embodiment of the additional logic required to program the horizontal input multiplexers 22 is shown in FIG. 8. Horizontal multiplexer programming blocks 116 are connected to the horizontal input multiplexers 22 associated with each logic array block 12. A vertical multiplexer programming block 118 in each row is connected to all of the horizontal input multiplexers 22 in that row. Together the horizontal multiplexer programming block 116 and vertical multiplexer programming block 118 provide horizontal and vertical programming addresses for programming the horizontal input multiplexers 22.

Each horizontal multiplexer programming block 116 contains registers 120 for holding horizontal programming data. The horizontal programming data is provided to the row of horizontal multiplexer programming blocks 116 by switches 122, which are enabled when it is desired to enter the data. Each horizontal multiplexer programming block 116 contains a demultiplexer 124 and a multiplexer 125, so that if a column of logic array blocks 12 is found to contain defective circuitry, the horizontal multiplexer programming blocks 116 in that column can be bypassed, as horizontal programming block 82 is bypassed (FIGS. 5 and 6). Although not shown in FIG. 8, horizontal multiplexer programming blocks 116 preferably contain a logic element such as logic element 99 (FIG. 6) for ensuring that the input to each chain of registers 120 in a horizontal programming block can be maintained at a logic low when registers 120 are bypassed, so that registers 120 are not inadvertently provided with a logic high.

Vertical multiplexer programming blocks 118, which contain registers 126, receive programming data for the horizontal input multiplexers 22 via switch 128. Data may be read out of registers 126 via switch 130. In a preferred embodiment, vertical multiplexer programming blocks 118 each contain 198 registers 126, one for each multiplexer in the six columns of logic array blocks 12 that are programmed by the user. The programming data from the 198 registers is provided to each of the horizontal input multiplexers 22 in each row via one of buses 132.

Figure 9:
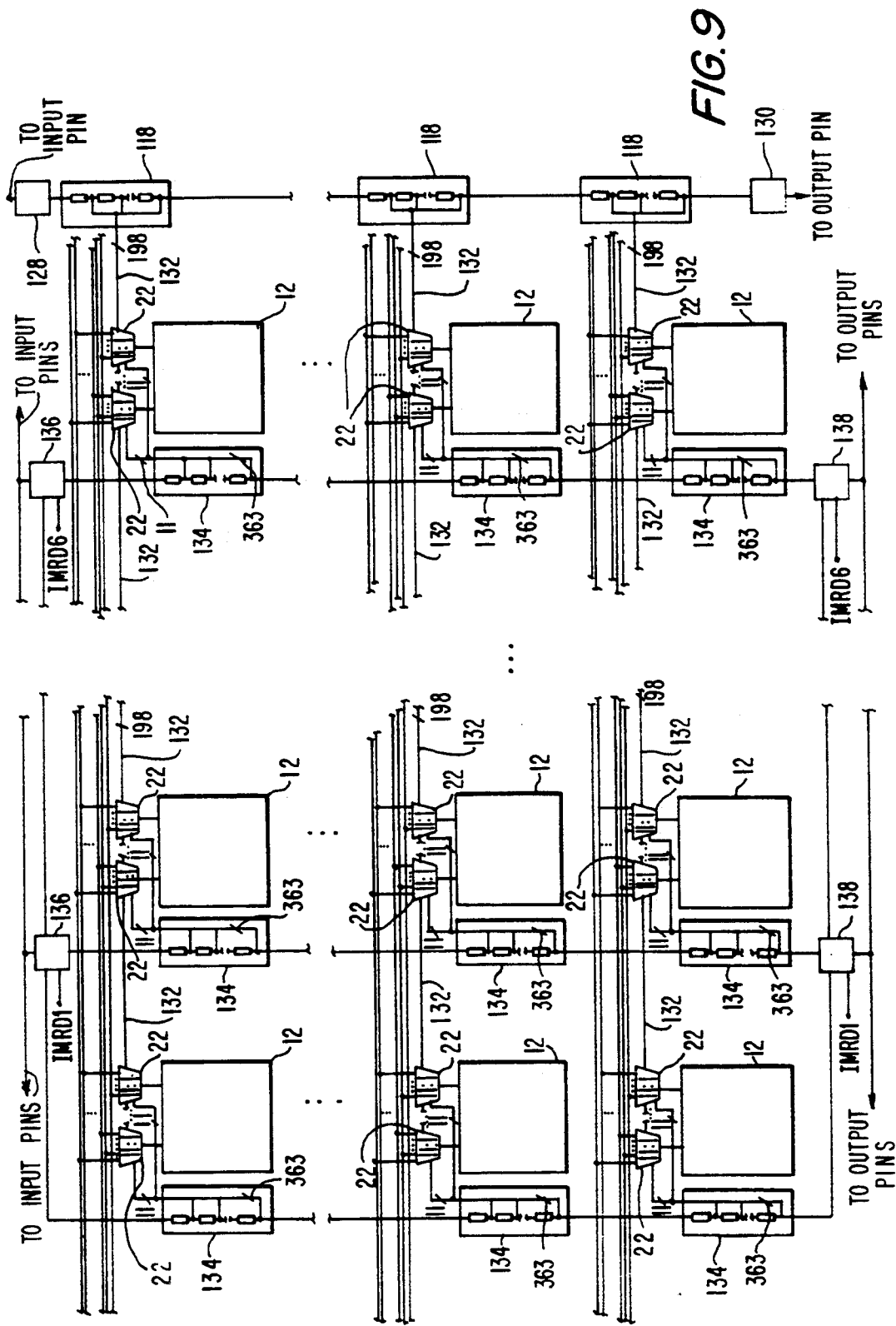
FIG. 9 is a simplified schematic diagram showing how horizontal multiplexer programming signals are redirected when redundant column logic is used in accordance with an alternative illustrative embodiment of the invention.

It is also possible to configure logic array blocks 12 and horizontal input multiplexers 22 using different programming block arrangements. For example, as shown in FIG. 9, horizontal input multiplexers 22 can be configured using vertically-loaded multiplexer programming blocks 134, rather than using horizontally-loaded horizontal programming blocks 116 (FIG. 8). If vertically-loaded multiplexer programming blocks 134 are used, programming data can be shifted away from a column found to contain defective circuitry using switches 136, which operate in the same fashion as switches 72 (FIG. 5). Programming data can be directed out of the columns using switches 138, which operate in the same way that switches 108 operate (FIG. 5).

When a redundant column logic arrangement is used, it is not necessary to provide additional circuitry for reconfiguring the programming data paths for the programming logic that is used to program demultiplexers 24, multiplexers 28, and tristate drivers 26 (FIG. 2), because the connections of horizontal conductors 14 and vertical conductors 16 to demultiplexers 24, multiplexers 28, and tristate drivers 26 are not shifted.

Figure 10:
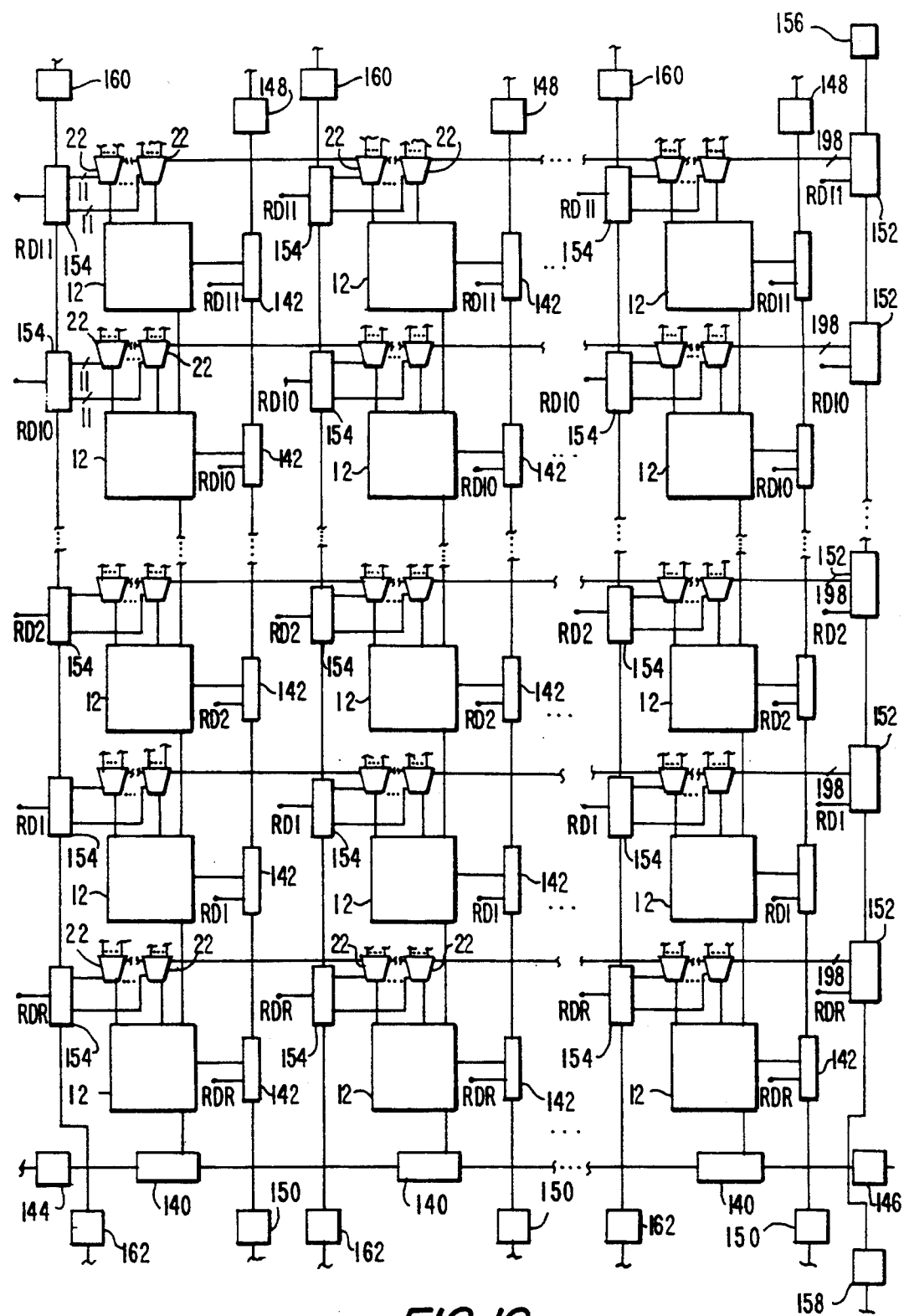
FIG. 10 is a simplified schematic diagram showing how logic array block and horizontal multiplexer programming signals are redirected when redundant row logic is used in accordance with an illustrative embodiment of the invention.

The suitability of a particular programming block configuration depends on a number of factors, including the level of performance desired, cost, and ease of use. Similarly, the decision of whether to use redundant columns or redundant rows depends on a number of variables. If it is desired to provide a programmable logic device that has one or more redundant rows of logic, rather than redundant columns, the programming blocks that are used to program logic array blocks 12 and the horizontal input multiplexers 22 are preferably configured as shown in FIG. 10, which shows how a redundant row may be added to programmable logic device 10 as the bottom most row. To avoid overcomplicating the drawing, various circuit elements have been omitted from FIG. 10. For example, vertical conductors 16 and horizontal conductors 14 are shown in FIG. 2, but are not shown in FIG. 10.

If redundant row logic is used, the outputs of logic array blocks 12 are not shifted, but rather are connected directly to vertical conductors 16 via demultiplexers 24 and to horizontal conductors 14 via multiplexers 28 and tristate drivers 26. Logic array blocks 12 are programmed using horizontal programming blocks 140 and vertical programming blocks 142. When it is desired to program logic array blocks 12, switch 144 is enabled, which allows horizontal programming data to be passed to horizontal programming blocks 140. Data may be read out of horizontal programming blocks 140 using switch 146. Horizontal programming blocks 140 are similar to vertical programming blocks 74 (FIGS. 5 and 6). Each horizontal programming block contains a serially linked chain of registers, to which all of the logic array blocks 12 in a column are connected. Because with a row-redundancy scheme all columns of logic array blocks 12 are used, the horizontal programming blocks 140 are not bypassed and therefore do not contain bypass demultiplexers and multiplexers.

Vertical programming blocks 142 resemble horizontal programming blocks 92, because each contains a serially linked chain of registers and each contains a demultiplexer and a multiplexer, which allow the registers to be bypassed. Vertical programming blocks 142 receive "RD" control signals, similar to the control signals received at control terminals 96 (FIG. 6). If defective circuitry is found in a row, the manufacturer configures the device so that the control terminal of each vertical programming block 142 in the defective row is provided with a logic low, causing the vertical programming blocks 142 in that row to be bypassed. The control terminals of the vertical programming blocks 142 in the other rows are provided with a logic high, so that in the vertical programming blocks 142 in those rows, programming data flows through the chain of registers. Programming data is provided to vertical programming blocks 142 via switches 148. When it is desired to read out the programming data stored in vertical programming blocks 142, switches 150 are enabled.

When row redundancy is used, it is necessary to provide additional circuitry for reconfiguring the paths for the programming data used to program demultiplexers 24, multiplexers 28, and tristate drivers 26 (FIG. 2). Preferably, the programming blocks for programming demultiplexers 24, multiplexers 28, and tristate drivers 26 are arranged in the same way that horizontal programming blocks 140 and vertical programming blocks 142 are arranged. If desired, horizontal programming blocks 140 and vertical programming blocks 142 can be provided with additional storage registers for programming demultiplexers 24, multiplexers 28, and tristate drivers 26. In contrast to the column redundancy arrangement, all columns of logic array blocks 12 are connected to demultiplexers 24, multiplexers 28, and tristate drivers 26. Each column of logic array blocks 12 is therefore connected to a column of vertical conductors 16, whereas with the column redundancy scheme it was not necessary to provide vertical conductors 16, demultiplexers 24, multiplexers 28, or tristate drivers 26 for the redundant column.

Horizontal input multiplexers 22 are programmed using vertical multiplexer programming blocks 152 and horizontal multiplexer programming blocks 154. Vertical multiplexer programming blocks 152 are similar to horizontal multiplexer programming blocks 82 (FIG. 6). Each vertical multiplexer programming block 152 contains a chain of 198 serially connected registers and a demultiplexer and a multiplexer that may be used to bypass the registers. Each register stores data for programming one of the horizontal input multiplexers 22 in the row. The demultiplexer and multiplexer receive the "RD" control or bypass signals that are supplied to the vertical programming blocks 142. Programming data is provided to vertical programming multiplexer blocks 152 via switch 156. When it is desired to read out programming data from vertical multiplexer programming blocks 152, switch 158 is enabled.

Horizontal multiplexer programming blocks 154 are loaded by enabling switches 160. Programming data may be read out of horizontal multiplexer programming blocks 154 via switches 162. One of the horizontal multiplexer programming blocks 154 is used to program each set of horizontal input multiplexers 22. If defective logic circuitry is discovered in one of the rows of logic array blocks 12, then the manufacturer can configure programmable logic device 10 so that the horizontal multiplexer programming block 154 in the defective row is bypassed. As with vertical multiplexer programming blocks 152 and vertical programming blocks 142, horizontal multiplexer programming blocks 154 can be bypassed by applying the appropriate "RD" signal, which causes a demultiplexer and multiplexer in the horizontal multiplexer programming block 154 to bypass the registers within the block.

Figure 11:
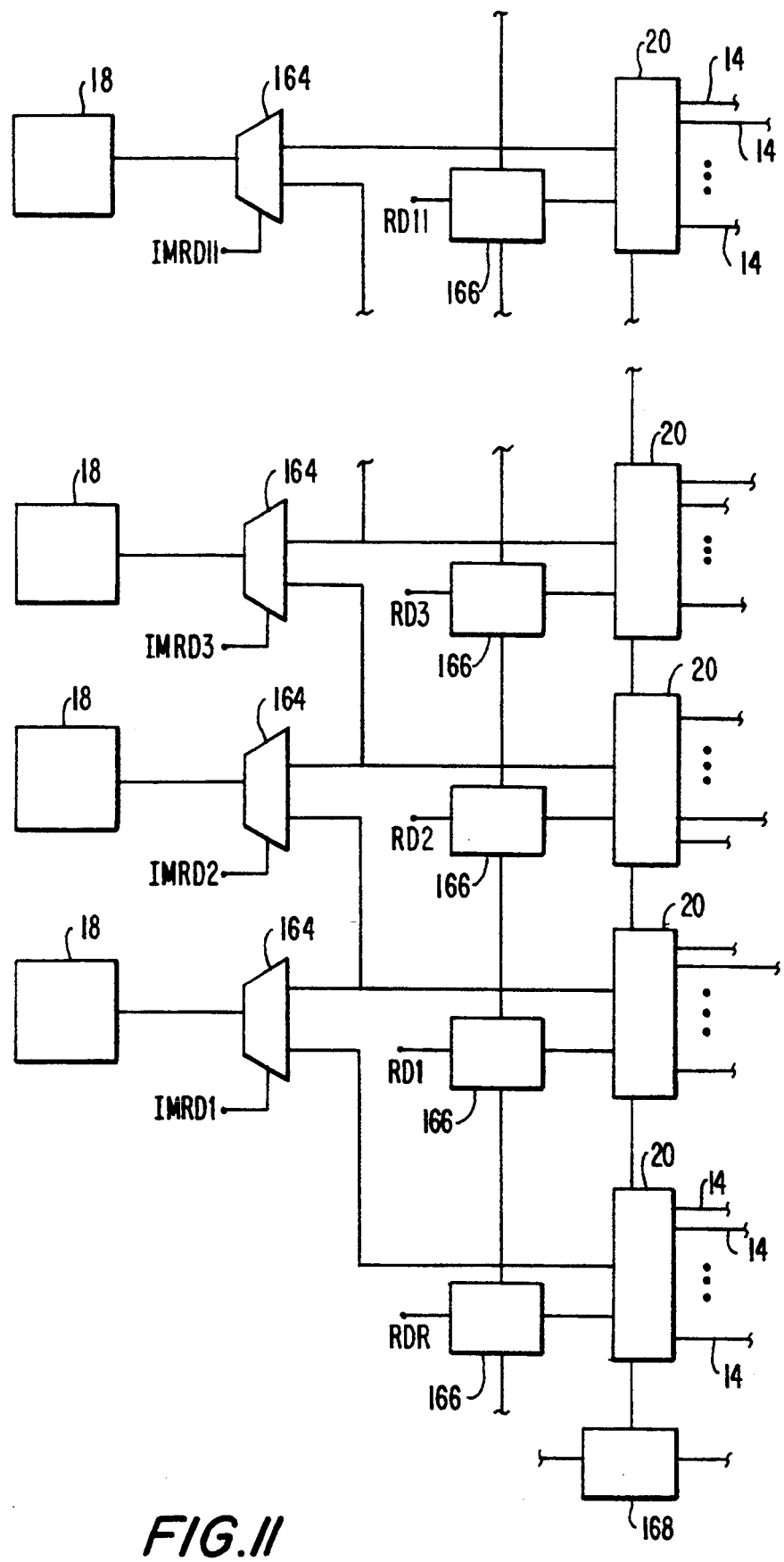
FIG. 11 is a simplified schematic diagram showing how the horizontal conductors are selectively connected to the input/output pins when redundant row logic is used in accordance with an illustrative embodiment of the invention.

In addition to reconfiguring the programming data paths when the manufacturer switches redundant row circuitry into use, the connections between the horizontal conductors 14 and input/output pins 18 must also be reconfigured. If the redundant (bottom most) row of logic array blocks 12 is switched into use, the input and output signals to and from input/output pins 18 must be shifted accordingly. As shown in FIG. 11, multiplexers 164 can be used to form a shifting circuit similar to the circuit shown in FIG. 7, which directs the signals between input/output pins 18 and horizontal conductors 14. To avoid over-complicating the drawing only one input/output pin 18 is shown connected to each block of input/output logic 20. However, in a preferred embodiment, in each row there are 16 input/output pins 18 connected to a block of input/output logic 20 at one end of horizontal conductors 14 and an identical arrangement at the opposite end. The redundant row contains a set of horizontal conductors 14 and a block of input/output logic 20, but does not have a corresponding set of input/output pins 18. If the redundant row is used, the horizontal conductors 14 in the redundant row are connected to the input/output pins 18 in the first row.

Each of the input/output pins 18 in a row is connected to an identically configured multiplexer 164. Multiplexers 164 are controlled using "IMRD" signals generated by a circuit such as the one shown in FIG. 4. For example, if the third normal row of logic array blocks from the bottom of programmable logic device 10 is defective, then a circuit of the type shown in FIG. 4 may be used to generate IMRD1, IMRD2, and IMRD3 signals that are low and signals IMRD4-11 that are high. In response to the IMRD1 signal, the multiplexers 164 in the first row connect the 16 input/output pins 18 in the first row to the input/output logic 20 in the redundant row. Similarly, the input/output pins 18 in the second row are connected to the input/output logic 20 of the first row and the input/output pins 18 in the third row are connected to the input/output logic 20 in the second row. The input/output logic 20 in the third row is not connected to any of input/output pins 18. In the fourth through eleventh rows multiplexers 164 connect input/output pins 18 to the input/output logic 20 in the same row.

Input/output logic 20 contains multiplexers and demultiplexers that can be selectively programmed by a user to interconnect the desired horizontal conductors 14 with input/output pins 18. Input/output logic 20 can be programmed using vertical input/output programming blocks 166 and horizontal input/output programming blocks 168, which are similar to vertical programming blocks 142 and horizontal programming blocks 140. Vertical input/output programming data is vertically loaded into serially-connected vertical input/output programming blocks 166, which contain bypass demultiplexers and multiplexers that receive "RD" control signals. If defective circuitry is detected in a row of logic array blocks 12, the vertical input/output programming block 166 in that row can be bypassed.

As when using redundant columns of logic, after the manufacturer configures the circuitry that generates the RD and IMRD control signals, subsequent users can program programmable logic device 10 without knowing whether redundant row circuitry is being used.

It will be understood that the foregoing is merely illustrative of the principles of the invention, and that various modifications can be made by those skilled in the art without departing from the scope and spirit of the invention. For example, although only one redundant column is shown in the depicted column redundancy embodiment, it will be understood that two or more redundant columns can be provided if desired. Moreover, redundant columns can be distributed anywhere among the normal columns. Similarly, more than one redundant row can be provided if desired. Redundant rows can also be distributed anywhere among the normal rows can also be distributed anywhere among the normal rows. Further, both rows and columns can be replaced.

It is also possible to use various schemes to reconfigure the paths for the programming data. For example, alternative programming block arrangements are shown in FIGS. 8 and 9, which illustrate how horizontal multiplexer programming blocks can be horizontally or vertically loaded. When the blocks are horizontally loaded, the blocks in a column containing defective circuitry are bypassed. When the blocks are vertically loaded it is necessary to shift data upon loading to avoid loading the blocks in the defective column. It will therefore be understood that the foregoing descriptions of various embodiments of vertical and horizontal programming blocks are merely illustrative, and that in each case either a vertical or horizontal programming scheme could be used in which, as appropriate, either programming block bypassing or programming block data shifting is used.

The invention claimed is:

1. A programmable logic device comprising:
   a plurality of normal logic groups each having a plurality of input terminals and a plurality of output terminals;
   a plurality of sets of conductors, each set being associated with and adjacent to one of the normal logic groups, there being an equal number of normal logic groups and sets of conductors, the conductors each extending in a first dimension;
   at least one redundant logic group having a plurality of input terminals and a plurality of output terminals, the normal logic groups and the redundant logic group being arrayed in a second dimension perpendicular to the first dimension; and
   means associated with each set of conductors for selectively directing to each set of conductors one of: (a) signals from the output terminals of the logic group that is associated with and adjacent to that set and (b) signals from the output terminals of another logic group that is adjacent to the set.

2. The programmable logic device defined in claim 1, wherein the logic groups each contain a region of vertical programming logic for selectively configuring the logic groups in response to vertical programming data, the programmable logic device further comprising:
   a plurality of programmable switches for receiving the vertical programming data, each programmable switch being connected to a corresponding region of vertical programming logic, each programmable switch further being connected to a region of vertical programming logic in an adjacent logic group, the programmable switches further receiving and being responsive to control signals such that the vertical programming data that is received by each programmable switch is selectively directed to one of: (a) the corresponding region of vertical programming logic and (b) the region of vertical programming logic in the adjacent logic group.

3. The programmable logic device defined in claim 2 wherein the regions of vertical programming logic each contain a plurality of registers for storing the vertical programming data.

4. The programmable logic device defined in claim 1 further comprising:
   regions of horizontal programming logic for receiving horizontal programming data and for selectively configuring the logic groups in response to the horizontal programming data, the regions of horizontal programming logic being serially connected to one another, such that the horizontal programming data passes from one region of horizontal programming logic to the next, wherein the regions of horizontal programming logic further receive and are responsive to bypass signals that cause a selected region of horizontal programming logic to be bypassed.

5. The programmable logic device defined in claim 4 wherein the regions of horizontal programming logic comprise:
 a plurality of registers for storing the horizontal programming data; and
 means for bypassing the registers in response to the bypass signals.

6. The programmable logic device defined in claim 1 wherein the means for selectively directing comprises a plurality of programmable multiplexers for selectively directing to each set of conductors one of: (a) the signals from the output terminals of the normal logic group that is associated with and adjacent to that set, and (b) the signals from the output terminals of another normal logic group that is adjacent to the set or the signals at the output terminals of the redundant logic group.

7. The programmable logic device defined in claim 1 further comprising control signal circuitry for receiving a plurality of stored signals and generating a corresponding plurality of control signals, the control signal circuitry having a plurality of identical subcircuits, each subcircuit comprising:
 a first terminal for receiving the stored signal;
 a second terminal for providing a second terminal output signal;
 a third terminal for receiving the second terminal output signal of another subcircuit; and
 a fourth terminal for providing one of the control signals, the second terminal output signal having a first logic level only when the stored signal is at a second logic level equal to the inverse of the first logic level and the second terminal output signal that is received at the third terminal is at the first logic level, the control signal having the second logic level only when the stored signal is at the second logic level and the output signal received at the third terminal is at the first logic level.

8. The programmable logic device defined in claim 1, wherein the logic groups each contain a plurality of macrocells, each macrocell generating an output signal that is applied to one of the output terminals.

9. The programmable logic device defined in claim 1 further comprising:
 a set of horizontal input multiplexers, associated with each logic group, each horizontal input multiplexer having a plurality of horizontal multiplexer input terminals for receiving input signals and at least one horizontal multiplexer output terminal connected to one of the logic group input terminals, the horizontal input multiplexers receiving horizontal and vertical multiplexer programming data which causes each horizontal input multiplexer to selectively direct one of the input signals at a selected one of the horizontal multiplexer input terminals to the horizontal multiplexer output terminal;
 a plurality of horizontal multiplexer programming blocks, each connected to one of the sets of horizontal input multiplexers for providing the horizontal multiplexer programming data to the horizontal input multiplexers; and
 at least one vertical multiplexer programming block connected to a plurality of the horizontal input multiplexers for providing the vertical multiplexer programming data to the horizontal input multiplexers.

10. The programmable logic device defined in claim 9 wherein the horizontal multiplexer programming blocks contain data storage registers for storing the horizontal multiplexer programming data, wherein at least some of the horizontal multiplexer programming blocks are connected in serial and are responsive to bypass signals, and wherein when one of the horizontal multiplexer programming blocks receives one of the bypass signals that horizontal multiplexer programming block is bypassed.

11. A programmable logic device comprising:
 a plurality of logic array blocks each having a plurality of data input terminals for receiving data input signals and a plurality of data output terminals, each of the logic array blocks being capable of being programmed to provide data output signals at the data output terminals that are a selected logical function of the data input signals, wherein the logic array blocks are arranged in a plurality of rows, a plurality of normal columns, and at least one redundant column;
 a plurality of sets of vertical conductors, one set of vertical conductors being contained within each of the normal columns;
 a plurality of sets of horizontal conductors, one set of horizontal conductors being contained within each of the rows; and
 means associated with each set of vertical conductors for selectively directing to each set of vertical conductors one of: (a) signals from the data output terminals of a logic array block that is in the same column as the set and (b) signals from the data output terminals of a logic array block that is in a column adjacent to the column containing the set.

12. The programmable logic device defined in claim 11 further comprising:
 a vertical programming block in each column and each row for selectively configuring the logic array blocks in response to vertical programming data; and
 a programmable switch in each normal column for directing the vertical programming data, each programmable switch being connected to a vertical programming block in the same column as the programmable switch and each programmable switch being connected to a vertical programming block in an adjacent column, the programmable switches receiving and being responsive to control signals such that the vertical programming data that is received by each programmable switch can be selectively directed to one of: (a) a vertical programming block in the same column as the programmable switch and (b) a vertical programming block in the column adjacent to the column containing the programmable switch.

13. The programmable logic device defined in claim 12 wherein each of the vertical programming blocks contains a plurality of registers for storing the vertical programming data.

14. The programmable logic device defined in claim 11 further comprising:

a horizontal programming block in each column for selectively configuring logic array blocks in that column in response to horizontal programming data, the horizontal programming blocks being serially connected to one another, such that the horizontal programming data passes from one horizontal programming block to the next, wherein the horizontal programming blocks receive and are responsive to bypass signals, which cause a selected horizontal programming block to be bypassed.

15. The programmable logic device defined in claim 14, wherein the horizontal programming blocks comprise:
   a plurality of registers for storing the horizontal programming data; and
   means for bypassing the registers in response to the bypass signals.

16. The programmable logic device defined in claim 11, wherein the means for selectively directing comprises a plurality of programmable multiplexers each having a programmable multiplexer output terminal and first and second programmable multiplexer input terminals, each programmable multiplexer output terminal being coupled to one of the vertical conductors, each first multiplexer input terminal being connected to one of the data output terminals of a logic array block that is in the same column as the vertical conductor to which the programmable multiplexer output terminal is coupled, and each second multiplexer input terminal being connected to one of the data output terminals of a logic array block that is in an adjacent column.

17. The programmable logic device defined in claim 11 further comprising control signal circuitry for receiving a plurality of stored signals and generating a corresponding plurality of control signals, the control signal circuitry having a plurality of identical subcircuits, each subcircuit comprising:
   a first terminal for receiving the stored signal;
   a second terminal for providing a second terminal output signal;
   a third terminal for receiving the second terminal output signal of another subcircuit; and
   a fourth terminal for providing one of the control signals, the second terminal output signal having a first logic level only when the stored signal is at a second logic level equal to the inverse of the first logic level and the second terminal output signal that is received at the third terminal is at the first logic level, the control signal having the second logic level only when the stored signal is at the second logic level and the output signal received at the third terminal is at the first logic level.

18. The programmable logic device defined in claim 11, wherein each logic array block contains a plurality of macrocells, each macrocell generating one of the data output signals that is applied to the data output terminals.

19. The programmable logic device defined in claim 11 further comprising:
   a plurality of sets of horizontal input multiplexers, each set being associated with one of the logic array blocks, each horizontal input multiplexer having a plurality of horizontal multiplexer input terminals and a horizontal multiplexer output terminal, each horizontal multiplexer output terminal being connected to one of the logic array block data input terminals, the horizontal input multiplexers receiving horizontal and vertical multiplexer programming data, each horizontal input multiplexer selectively connecting one of the horizontal multiplexer input terminals to the horizontal multiplexer output terminal in response to the vertical and horizontal multiplexer programming data;
   a plurality of horizontal multiplexer programming blocks, each connected to one of the sets of horizontal input multiplexers for providing the horizontal multiplexer programming data to the horizontal input multiplexers; and
   a vertical multiplexer programming block in each row connected to each of the horizontal input multiplexers in that row for providing the vertical multiplexer programming data to the horizontal input multiplexers.

20. A programmable logic device comprising:
   a plurality of logic array blocks each having a plurality of data input terminals for receiving data input signals and a plurality of data output terminals, each of the logic array blocks being capable of receiving programming data for configuring the logic array block to provide data output signals at the data output terminals that are a selected logical function of the data input signals, wherein the logic array blocks are arranged in a plurality of columns, a plurality of normal rows, and at least one redundant row;
   a plurality of sets of vertical conductors, each column containing one of the sets of vertical conductors;
   a plurality of sets of horizontal conductors, each row containing one of the sets of horizontal conductors;
   horizontal input means associated with each logic array block for selectively connecting the horizontal conductors to the data input terminals of that logic array block;
   means for selectively directing the data output signals at the data output terminals of each logic array block to at least some of the horizontal conductors in the same row as that logic array block;
   a set of input/output pins contained within each row; and
   means for selectively connecting each set of input/output pins to the horizontal conductors in one of: (a) the same row that contains the set of input/output pins and (b) a row adjacent to the row containing the set of input/output pins.

21. The programmable logic device defined in claim 20 further comprising:
   a plurality of vertical programming blocks, each connected to one of the logic array blocks for providing the logic array blocks with vertical programming data, the vertical programming blocks in each column being connected in serial and being responsive to bypass signals so that when a row is found to contain defective circuitry the vertical programming blocks in that row are bypassed by applying the bypass signals to those vertical programming blocks.

22. The programmable logic device defined in claim 21 wherein each vertical programming block contains a plurality of serially connected data storage registers and a demultiplexer and a multiplexer, the demultiplexer and multiplexer receiving and being responsive to the bypass signals so that the data storage registers can be bypassed when the bypass signals are applied to the demultiplexer and the multiplexer.

23. The programmable logic device defined in claim 20 further comprising:

a plurality of horizontal programming blocks for providing the logic array blocks with horizontal programming data, each column containing one of the horizontal programming blocks and each horizontal programming block being connected to each of the logic array blocks in the column.

24. The programmable logic device defined in claim 23 wherein each of the horizontal programming blocks contains a plurality of data storage registers for storing the horizontal programming data.

25. The programmable logic device defined in claim 20 further comprising:

a plurality of horizontal multiplexer programming blocks, each connected to one of the horizontal input means, the horizontal multiplexer programming blocks providing the horizontal input means with horizontal multiplexer programming data, the horizontal multiplexer programming blocks in each column being serially connected and being responsive to bypass signals so that if a row is found to contain defective circuitry the horizontal multiplexer programming blocks in that row can be bypassed.

26. The programmable logic device defined in claim 25 wherein the horizontal multiplexer programming blocks each contain a plurality of serially connected data storage registers, a demultiplexer, and a multiplexer, the demultiplexer and the multiplexer receiving and being responsive to the bypass signals so that the data storage registers can be bypassed when the bypass signals are applied to the demultiplexer and the multiplexer.

27. The programmable logic device defined in claim 20 further comprising:

a plurality of vertical multiplexer programming blocks, each contained within one of the rows and being connected to each of the horizontal input means in the row for providing the horizontal input means with vertical multiplexer programming data, the vertical multiplexer programming blocks being serially connected and being responsive to bypass signals so that if a row is found to contain defective circuitry the vertical multiplexer programming block in that row can be bypassed.

28. The programmable logic device defined in claim 27 wherein each of the vertical multiplexer programming blocks contains a plurality of serially connected data storage registers, a demultiplexer, and a multiplexer, the demultiplexer and the multiplexer receiving and being responsive to the bypass signals so that the data storage registers can be bypassed when the bypass signals are applied to the demultiplexer and multiplexer.

29. The programmable logic device defined in claim 20 wherein each horizontal input means comprises a plurality of horizontal input multiplexers, each horizontal input multiplexer having a plurality of horizontal input multiplexer input terminals connected to some of the horizontal conductors and a horizontal input multiplexer output terminal connected to one of the input terminals of one of the logic array blocks.

30. The programmable logic device defined in claim 20 wherein each of the logic array blocks contains a plurality of macrocells, each macrocell generating one of the data output signals applied to the output terminals.

31. The programmable logic device defined in claim 20 further comprising:

a plurality of vertical input/output programming blocks connected to the means for selectively connecting, each row containing one of the vertical input/output programming blocks for providing vertical input/output programming data to program the means for selectively connecting; and a horizontal input/output programming block connected to the means for selectively connecting for providing horizontal input/output programming data to program the means for selectively connecting.

* * * * *